(12) United States Patent  
Song et al.

(10) Patent No.: US 12,166,010 B2  
(45) Date of Patent: Dec. 10, 2024

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Eunseok Song, Hwaseong-si (KR); Kyung Suk Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 95 days.

(21) Appl. No.: 17/229,974

(22) Filed: Apr. 14, 2021

(65) Prior Publication Data

US 2022/0059505 A1 Feb. 24, 2022

(30) Foreign Application Priority Data

Aug. 20, 2020 (KR) .................. 10-2020-0104565

(51) Int. Cl.
| | |
|---|---|
| *H01L 25/065* | (2023.01) |
| *H01L 23/31* | (2006.01) |
| *H01L 23/522* | (2006.01) |
| *H01L 23/538* | (2006.01) |

(52) U.S. Cl.
CPC .......... *H01L 25/0657* (2013.01); *H01L 23/31* (2013.01); *H01L 23/5223* (2013.01); *H01L 23/5384* (2013.01); *H01L 23/5385* (2013.01); *H01L 23/5386* (2013.01)

(58) Field of Classification Search
CPC ... H01L 23/5223; H01L 23/642; H01L 23/31; H01L 2224/08265; H01L 2224/16145; H01L 25/0652; H01L 25/0657; H01L 25/112; H01L 25/117; H01L 25/115; H01L 2924/15174

See application file for complete search history.

(56) References Cited

U.S. PATENT DOCUMENTS

| | | | |
|---|---|---|---|
| 6,346,743 B1* | 2/2002 | Figueroa | H01L 23/642 |
| | | | 361/306.3 |
| 9,041,212 B2 | 5/2015 | Kim et al. | |
| 9,076,754 B2 | 7/2015 | Hung et al. | |
| 9,337,138 B1* | 5/2016 | Abugharbieh | H01L 23/642 |
| 9,922,964 B1 | 3/2018 | Chen et al. | |
| 10,062,665 B2 | 8/2018 | Chen et al. | |
| 10,290,571 B2 | 5/2019 | Yu et al. | |

(Continued)

FOREIGN PATENT DOCUMENTS

KR 10-2018-0054419 A 5/2018

*Primary Examiner* — Victor A Mandala
*Assistant Examiner* — Lawrence C Tynes, Jr.
(74) *Attorney, Agent, or Firm* — F. Chau & Associates, LLC

(57) ABSTRACT

A semiconductor package includes a substrate, an interposer on the substrate, a semiconductor chip stack on the interposer, a silicon capacitor layer on the interposer, a first semiconductor chip on the silicon capacitor layer, and a molding layer at least partially surrounding side surfaces of the semiconductor chip stack, the silicon capacitor layer and the first semiconductor chip. The semiconductor chip stack and the first semiconductor chip are laterally spaced apart from each other. A top surface of the first semiconductor chip is coplanar with a top surface of the molding layer and a top surface of the semiconductor chip stack.

14 Claims, 12 Drawing Sheets

(56) References Cited

U.S. PATENT DOCUMENTS

| | | | |
|---|---|---|---|
| 10,319,699 B2 | 6/2019 | Wei et al. | |
| 10,529,690 B2 | 1/2020 | Shih et al. | |
| 10,535,633 B2 | 1/2020 | Wei et al. | |
| 10,658,300 B2 | 5/2020 | Kim et al. | |
| 11,205,639 B2* | 12/2021 | Kim | H01L 25/0657 |
| 2017/0263693 A1* | 9/2017 | Oikawa | H01L 28/60 |
| 2018/0138151 A1* | 5/2018 | Shih | H01L 25/50 |
| 2020/0013754 A1 | 1/2020 | Gao et al. | |
| 2020/0020647 A1 | 1/2020 | Jee et al. | |
| 2020/0161230 A1* | 5/2020 | Knickerbocker | H01L 23/481 |
| 2021/0020574 A1* | 1/2021 | Yu | H01L 21/6835 |
| 2021/0091056 A1* | 3/2021 | Yu | H01L 25/167 |
| 2021/0118794 A1* | 4/2021 | Ding | H01L 28/60 |
| 2021/0193637 A1* | 6/2021 | Jeng | H01L 23/5384 |
| 2021/0305121 A1* | 9/2021 | Mallik | H01L 23/18 |
| 2021/0305163 A1* | 9/2021 | Akkinepally | H01L 25/0655 |

\* cited by examiner

SEMICONDUCTOR PACKAGE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2020-0104565, filed on Aug. 20, 2020, in the Korean Intellectual Property Office, the disclosure of which is hereby incorporated by reference in its entirety.

TECHNICAL FIELD

Embodiments of the inventive concepts relate to a semiconductor package and a method of manufacturing the same, and more particularly, to a semiconductor package capable of increasing heat dissipation efficiency and power integrity (PI) characteristics and a method of manufacturing the same.

DISCUSSION OF RELATED ART

An integrated circuit chip may be implemented as a semiconductor package and used in electronic products. Typically, a semiconductor chip may be mounted on a substrate such as a printed circuit board (PCB), thereby forming the semiconductor package. A plurality of semiconductor chips may be mounted in a single semiconductor package. The plurality of semiconductor chips may be stacked on a single substrate, and may have various functions. Heat may be generated from a semiconductor chip in a semiconductor package. Various structures may be applied to dissipate the heat generated from the semiconductor chip to the outside. In addition, various structures may be applied to increase power integrity (PI) of power supplied to the semiconductor chip.

SUMMARY

In an aspect of the present disclosure, a semiconductor package includes a substrate, an interposer on the substrate, a semiconductor chip stack on the interposer, a silicon capacitor layer on the interposer, a first semiconductor chip on the silicon capacitor layer, and a molding layer at least partially surrounding side surfaces of the semiconductor chip stack, the silicon capacitor layer and the first semiconductor chip. The semiconductor chip stack and the first semiconductor chip may be laterally spaced apart from each other. A top surface of the first semiconductor chip may be coplanar with a top surface of the molding layer and a top surface of the semiconductor chip stack.

In an aspect of the present disclosure, a semiconductor package includes a substrate, an interposer located on the substrate and electrically connected to the substrate, a memory chip stack located on the interposer and electrically connected to the interposer, a passive element layer located on the interposer and electrically connected to the interposer, a logic chip located on the passive element layer and electrically connected to the passive element layer, and a molding layer at least partially surrounding side surfaces of the memory chip stack, the passive element layer and the logic chip. The memory chip stack may be provided in plurality, and the plurality of memory chip stacks may be laterally spaced apart from each other. The logic chip may be located between the plurality of memory chip stacks. A top surface of the logic chip may be coplanar with a top surface of each of the plurality of memory chip stacks. The passive element layer may include an embedded capacitor. A thickness of the passive element layer may be less than a thickness of the logic chip.

In an aspect of the present disclosure, a method of manufacturing a semiconductor package includes bonding a first wafer and a second wafer, sawing the first and second wafers bonded to each other to form a first semiconductor chip and a silicon capacitor layer, grinding a bottom surface of the silicon capacitor layer, coupling the first semiconductor chip and the silicon capacitor layer onto an interposer, and coupling a semiconductor chip stack onto the interposer. The silicon capacitor layer may include an embedded capacitor located therein.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
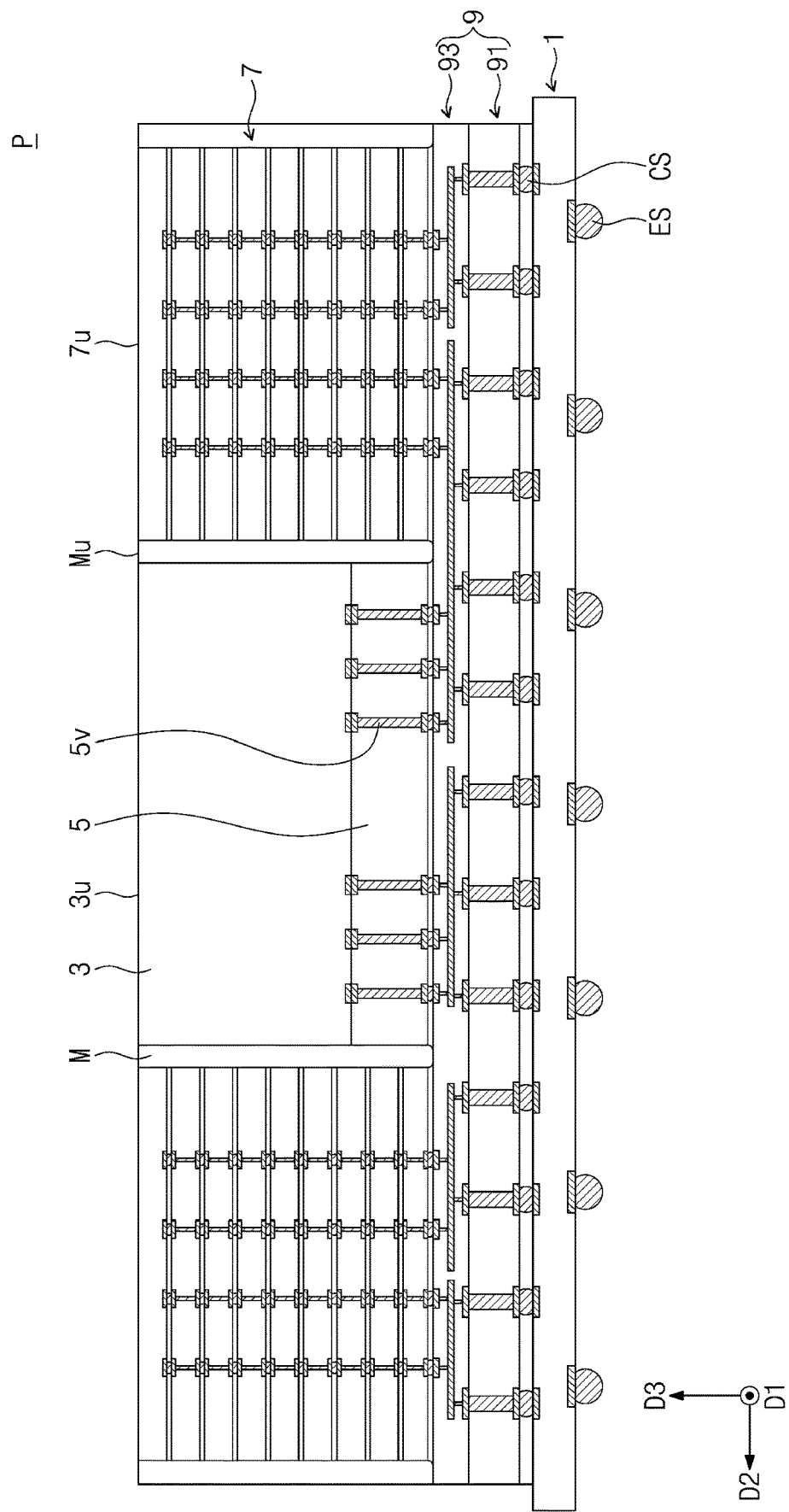
FIG. 1 is a cross-sectional view illustrating a semiconductor package according to some embodiments of the inventive concepts.

Hereinafter, embodiments of the inventive concepts will be described in detail with reference to the accompanying drawings. The same reference numerals or the same reference designators may denote the same elements or components throughout the specification.

FIG. 1 is a cross-sectional view illustrating a semiconductor package according to some embodiments of the inventive concepts.

Hereinafter, a reference designator 'D1' of FIG. 1 may be referred to as a first direction, and a reference designator 'D2' of FIG. 1 may be referred to as a second direction. A reference designator 'D3' intersecting the first and second directions D1 and D2 in FIG. 1 may be referred to as a third direction.

FIG. 1 illustrates a semiconductor package P. The semiconductor package P may refer to an electronic component in which a semiconductor chip is mounted on a substrate such as a printed circuit board (PCB). In some embodiments, the semiconductor package P may include a 2.5D package. The 2.5D package may refer to a single package in which a logic chip and a memory chip are mounted. For example, the 2.5D package may refer to a package in which the logic chip and the memory chip are laterally spaced apart from each other on a single substrate. However, embodiments of the inventive concepts are not necessarily limited thereto. The semiconductor package P may include another type of package.

The semiconductor package P may include a substrate 1, an interposer 9, a semiconductor chip stack (e.g., a memory chip stack) 7, a silicon capacitor layer 5, a first semiconductor chip 3, and a molding layer M.

The substrate 1 may connect a semiconductor chip to an external device. The substrate 1 may include a printed circuit board (PCB) and/or a redistribution layer (RDL). Hereinafter, the case in which the substrate 1 is the printed circuit board (PCB) will be described as an example for ease and convenience in explanation. An external connection ball ES may be provided on a bottom surface of the substrate 1. The external connection ball ES may be provided in plurality. The plurality of external connection balls ES may be laterally spaced apart from each other. The substrate 1 may be electrically connected to the semiconductor chip through the interposer 9.

The interposer 9 may be located on the substrate 1. The interposer 9 may connect the substrate 1 and the semiconductor chip to each other. The interposer 9 may include an interposer substrate 91 and an interconnection layer 93. The interposer substrate 91 may be connected to the substrate 1. For example, the interposer substrate 91 may be electrically connected to the substrate 1 through connection balls CS. The interposer substrate 91 may connect the substrate 1 and the interconnection layer 93 to each other. The interposer substrate 91 may include through-vias. This will be described later in more detail. The interconnection layer 93 may be coupled on the interposer substrate 91. The interconnection layer 93 may include vias and/or interconnection lines therein. The semiconductor chip (e.g., the memory chip stack 7) may be connected to the interposer substrate 91 through the vias and/or the interconnection lines in the interconnection layer 93.

The memory chip stack 7 may be coupled on the interposer 9. The memory chip stack 7 may include a plurality of memory chips which are vertically stacked. For example, the memory chip stack 7 may include 4, 8, 12 or 16 memory chips. However, embodiments of the inventive concepts are not necessarily limited thereto. The number of the memory chips in the memory chip stack 7 may vary. Thus, a thickness of the memory chip stack 7 may be variously determined. Therefore, a level of a top surface 7u of the memory chip stack 7 may also be variously determined. The memory chip stack 7 may further include a logic chip. For example, the logic chip may be disposed in a lower portion of the memory chip stack 7, and the plurality of memory chips may be stacked on the logic chip. For example, the memory chip stack 7 may include a high bandwidth memory (HBM) stack. The memory chip stack 7 may be provided in plurality. For example, two memory chip stacks 7 may be provided as illustrated in FIG. 1. The two memory chip stacks 7 may be laterally spaced apart from each other. This will be described later in more detail.

The silicon capacitor layer 5 may be coupled on the interposer 9. The silicon capacitor layer 5 may be laterally spaced apart from the memory chip stack 7. For example, portions of the molding layer M may be disposed between the silicon capacitor layer 5 and the memory chip stack 7. The silicon capacitor layer 5 may be a passive element layer. For example, an active element such as a diode and/or a transistor may not be located in the silicon capacitor layer 5. The silicon capacitor layer 5 may include only a passive element. For example, the silicon capacitor layer 5 may include an embedded capacitor and a through-via 5v.

The embedded capacitor may refer to a capacitor disposed in the silicon capacitor layer 5. For example, the embedded capacitor may not be a surface mounting technology (SMT) capacitor separately mounted on a surface of the silicon capacitor layer 5. The silicon capacitor layer 5 may connect the interposer 9 and the first semiconductor chip 3 to each other. The silicon capacitor layer 5 may be used to increase power integrity (PI) of the first semiconductor chip 3. The embedded capacitor may include a first electrode and a second electrode. The first electrode and the second electrode may be spaced apart from each other by a dielectric. Either the first electrode and the second electrode may be electrically connected to the through-via 5v. The other electrode of the first electrode and the second electrode may be connected to a ground electrode. For example, the embedded capacitor may be a decoupling capacitor or a bypass capacitor. The embedded capacitor of the silicon capacitor layer 5 may reduce noise of a frequency transmitted to the first semiconductor chip 3. The embedded capacitor may stabilize a voltage transmitted to the first semiconductor chip 3. Thus, the power integrity (PI) of the semiconductor package P may be increased by the embedded capacitor. The embedded capacitor may vary in shape across embodiments. For example, the first and second electrodes of the embedded capacitor may be completely buried in the silicon capacitor layer 5. Alternatively, portions of the first and second electrodes of the embedded capacitor may be exposed by a top surface of the silicon capacitor layer 5. In some embodiments, the embedded capacitor may include a multilayer ceramic capacitor (MLCC) in which thin layers are stacked. Alternatively, the embedded capacitor may another shape that is capable of operating as the decoupling capacitor in the silicon capacitor layer 5. The through-via 5v may penetrate the silicon capacitor layer 5 to connect the top surface and a bottom surface of the silicon capacitor layer 5. The through-via 5v may include a conductive material. The through-via 5v may be provided in plurality. The plurality of through-vias 5v may be laterally spaced apart from each other. The interconnection layer 93 and the first semiconductor chip 3 may be electrically connected to each other through the through-via 5v. A vertical thickness of the silicon capacitor layer 5 may be less than a vertical thickness of the memory chip stack 7. In addition, the thickness of the silicon capacitor layer 5 may be less than a thickness of the first semiconductor chip 3. This will be described later in more detail.

The first semiconductor chip 3 may be located on the interposer 9. The first semiconductor chip 3 may be coupled on the silicon capacitor layer 5. For example, the first semiconductor chip 3 may be coupled to the silicon capacitor layer 5 by a direct wafer bonding process. The first semiconductor chip 3 may be laterally spaced apart from the memory chip stack 7. The first semiconductor chip 3 may include a logic chip. A top surface 3u of the first semiconductor chip 3 may be exposed by the molding layer M. The top surface 3u of the first semiconductor chip 3 may be coplanar with a top surface Mu of the molding layer M. In addition, the top surface 3u of the first semiconductor chip 3 may be coplanar with the top surface 7u of the memory chip stack 7.

The molding layer M may be located on the interposer 9. The molding layer M may at least partially surround side surfaces of the memory chip stack 7, the first semiconductor chip 3 and the silicon capacitor layer 5. The molding layer M may protect the memory chip stack 7, the first semiconductor chip 3, and the silicon capacitor layer 5. The molding layer M may include an epoxy molding compound (EMC). However, embodiments of the inventive concepts are not necessarily limited thereto.

According to some embodiments of the inventive concepts, the top surface 3u of the first semiconductor chip may be exposed by the molding layer. For example, the top surface 3u of the first semiconductor chip may be coplanar with the top surface Mu of the molding layer M. Thus, heat generated from the first semiconductor chip 3 may be dissipated or released upward at an increased rate. For example, when the first semiconductor chip 3 includes the logic chip, a large amount of heat generated from the logic chip may be dissipated or released upward. Thus, performance of the first semiconductor chip 3 may increase.

According to some embodiments of the inventive concepts, the top surface 7u of the memory chip stack 7 may be exposed by the molding layer M. For example, the top surface 7u of the memory chip stack 7 may be coplanar with the top surface Mu of the molding layer M. Thus, heat generated from the memory chip stack may be easily dissipated or released upward. As a result, performance of the memory chip stack 7 may be increased.

According to some embodiments of the inventive concepts, the silicon capacitor layer 5 may be located under the first semiconductor chip 3, and thus the top surface 3u of the first semiconductor chip 3 may be coplanar with the top surface 7u of the memory chip stack 7. For example, even though the thickness of the first semiconductor chip 3 is less than the thickness of the memory chip stack 7, the silicon capacitor layer 5 may be disposed under the first semiconductor chip 3 to adjust a level of the top surface 3u of the first semiconductor chip 3. Thus, heat generated from the first semiconductor chip may dissipate at an increased rate.

According to some embodiments of the inventive concepts, even though the thickness of the memory chip stack is changed, the level of the top surface of the first semiconductor chip may be adjusted to correspond thereto. Thus, heat generated from the first semiconductor chip may be effectively dissipated regardless of the thickness of the memory chip stack.

According to some embodiments of the inventive concepts, the top surface of the first semiconductor chip and the top surface of the memory chip stack may be disposed at the same level by using the passive element layer formed by relatively simple processes. For example, the top surface of the first semiconductor chip may be exposed using the passive element layer formed by the simple processes. Thus, heat of the first semiconductor chip may be effectively dissipated while simplifying total processes. In addition, a process cost may be reduced by the simplification of the total processes.

According to some embodiments of the inventive concepts, the first semiconductor chip may not require a separate grinding process. For example, since the silicon capacitor layer for adjusting a height is disposed under the first semiconductor chip, there may be no need to grind the first semiconductor chip.

According to some embodiments of the inventive concepts, the embedded capacitor of the silicon capacitor layer may remove frequency noise supplied to the first semiconductor chip. Thus, power supplied to the first semiconductor chip may be stabilized. For example, the embedded capacitor may increase the power integrity (PI) of the first semiconductor chip.

According to some embodiments of the inventive concepts, the silicon capacitor layer may be located beneath the first semiconductor chip. Thus, the embedded capacitor may be close to the first semiconductor chip. For example, a signal distance between the embedded capacitor and the first semiconductor chip may be reduced. Since the embedded capacitor is located beneath the first semiconductor chip, the power integrity (PI) may be increased by the embedded capacitor.

Figure 2:
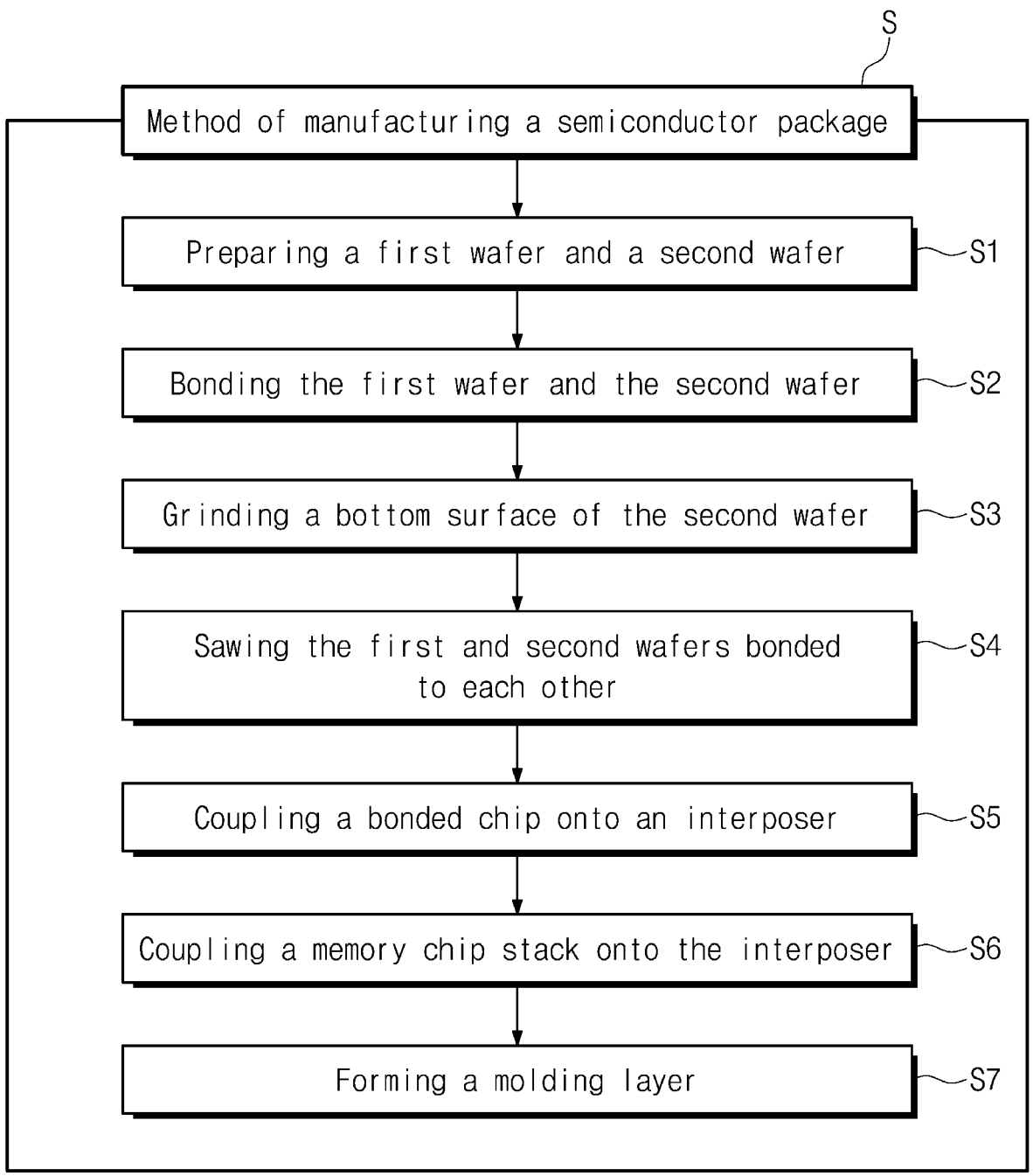
FIG. 2 is a flowchart illustrating a method of manufacturing a semiconductor package according to some embodiments of the inventive concepts.

FIG. 2 is a flowchart illustrating a method of manufacturing a semiconductor package, according to some embodiments of the inventive concepts.

FIG. 2 illustrates a method S of manufacturing a semiconductor package. The semiconductor package P of FIG. 1 may be manufactured by the method S of manufacturing the semiconductor package. The method S of manufacturing the semiconductor package may include preparing a first wafer and a second wafer (S1), bonding the first wafer and the second wafer (S2), grinding a bottom surface of the second wafer (S3), sawing the first and second wafers bonded to each other (S4), coupling a bonded chip onto an interposer (S5), coupling a semiconductor chip stack (e.g., a memory chip stack) onto the interposer (S6), and forming a molding layer (S7).

Hereinafter, each of the steps of the method S of manufacturing the semiconductor package will be described in detail with reference to FIGS. 3 to 11.

FIGS. 3 to 11 are cross-sectional views illustrating the method of manufacturing a semiconductor package, according to the embodiments of FIG. 2.

Figure 3:
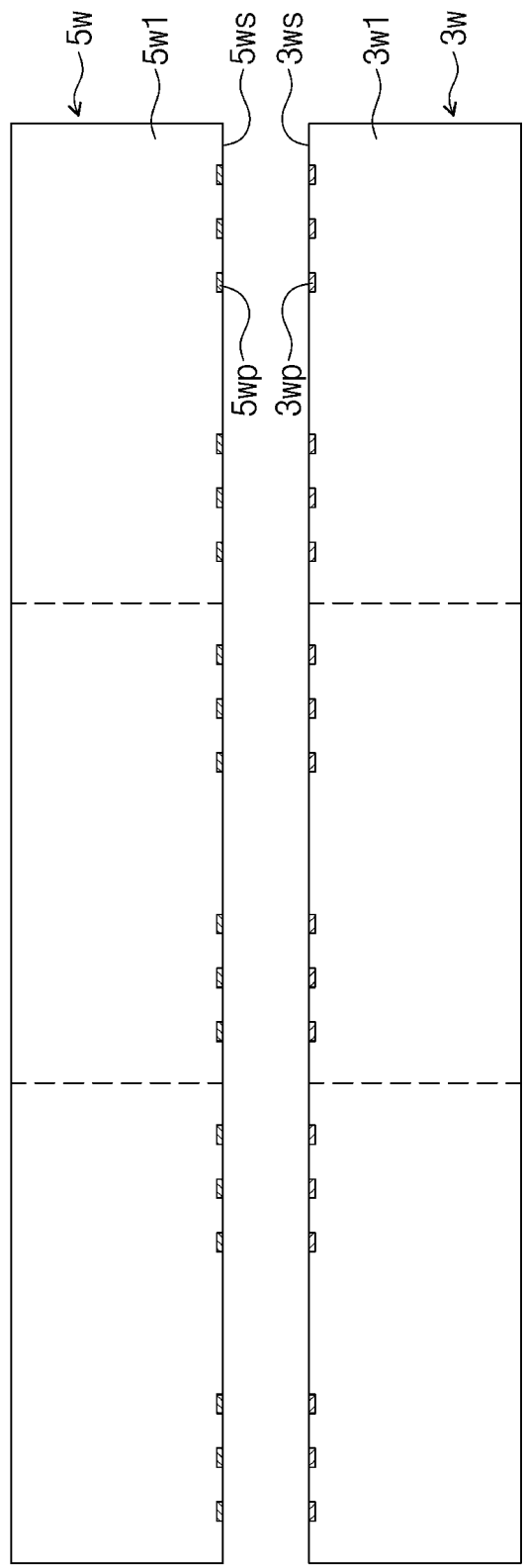
FIGS. 3 to 11 are cross-sectional views illustrating the method of manufacturing a semiconductor package according to the embodiments of FIG. 2.

Referring to FIGS. 2 and 3, the preparing of the first wafer and the second wafer (S1) may include forming a first wafer 3w and a second wafer 5w. Before sawing, the first wafer 3w may be in a "wafer state". For example, a body 3wl of the first wafer 3w may extend long in a horizontal direction. The first wafer 3w may include active elements and passive elements therein. For example, the first wafer 3w may include integrated circuits (ICs) formed through various processes. The second wafer 5w may be in a wafer state before sawing. For example, a body 5wl of the second wafer 5w may extend long in the horizontal direction. The second wafer 5w may not include an active element therein. The second wafer 5w may include only passive elements (e.g., an interconnection line and an embedded capacitor) therein. For example, the second wafer 5w may refer to a passive element layer, as distinguished from the first wafer 3w that includes the integrated circuit. A first pad 3wp may be provided at an active surface 3ws of the first wafer 3w. A second pad 5wp may be provided at an active surface 5ws of the second wafer 5w.

Figure 4:
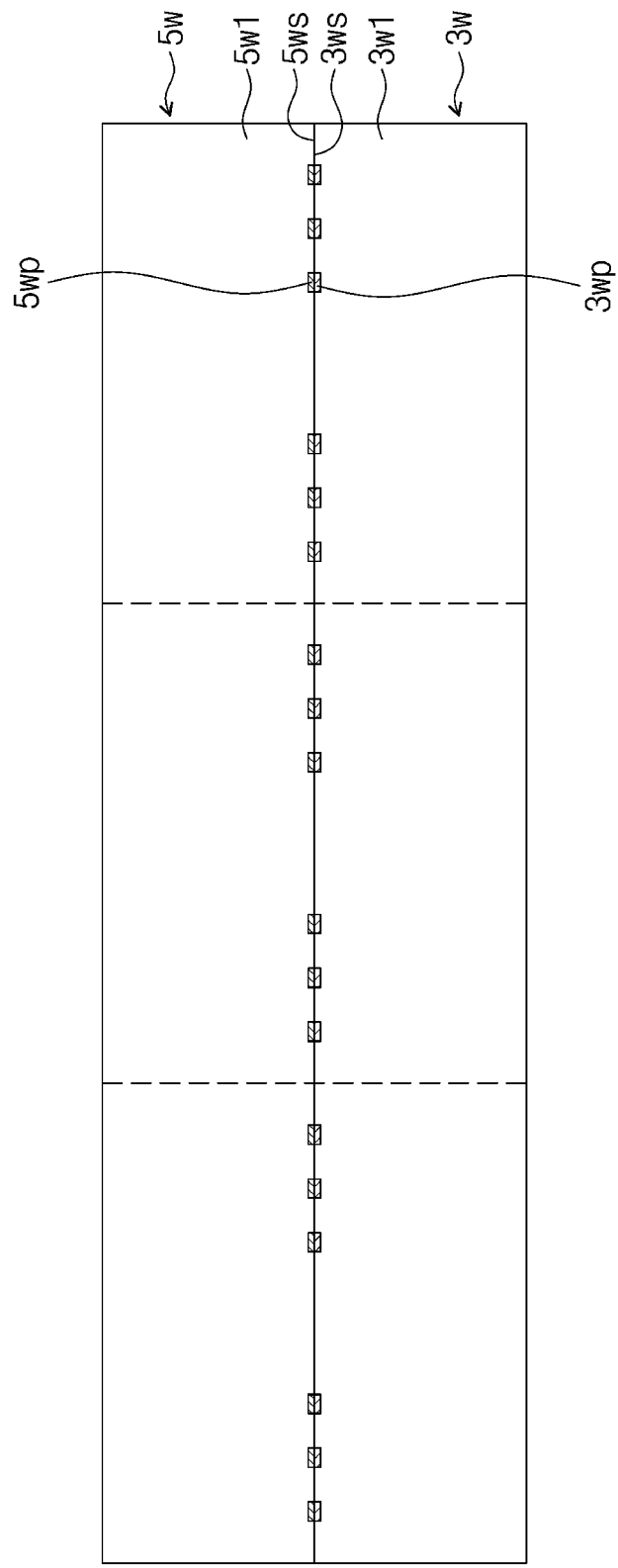

Referring to FIGS. 4 and 2, the bonding of the first wafer and the second wafer (S2) may include coupling the first wafer 3w and the second wafer 5w to each other by a direct wafer bonding process. In some embodiments, the direct wafer bonding process may include an oxide bonding process or a hybrid bonding process. The first wafer 3w may be bonded or coupled directly to the second wafer 5w by the direct wafer bonding process. For example, the active surface 3ws of the first wafer 3w may be in contact with the active surface 5ws of the second wafer 5w. The first pad 3wp may be in contact with the second pad 5wp.

According to the embodiments of the inventive concepts, the first semiconductor chip and the silicon capacitor layer may be bonded directly to each other by the direct wafer bonding process. Thus, the first semiconductor chip and the silicon capacitor layer may be coupled directly to each other without an additional bonding layer or adhesive layer. As a result, heat dissipation efficiency may be increased.

Figure 5:
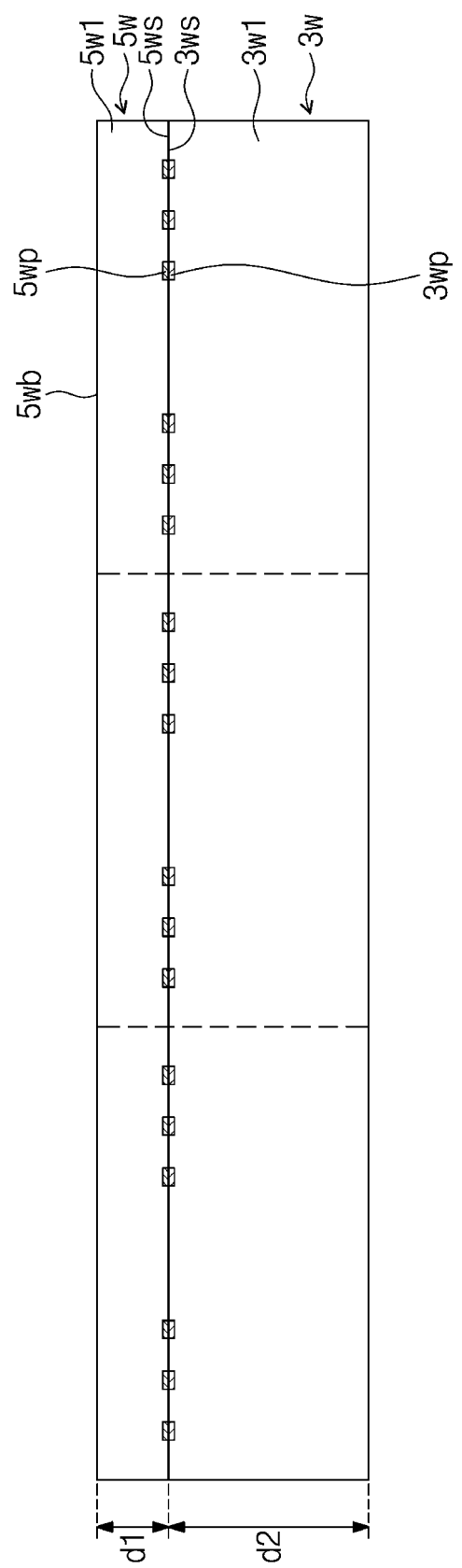

Referring to FIGS. 5 and 2, the grinding of the bottom surface of the second wafer (S3) may include grinding an inactive surface 5wb of the second wafer 5w. The bottom surface of the second wafer may refer to the inactive surface 5wb. The grinding process may be performed until a thickness of the second wafer 5w reaches a first thickness d1.

When the thickness of the second wafer 5w is the first thickness d1, a thickness of the first wafer 3w may be a second thickness d2. The first thickness d1 may be determined by the second thickness d2 and a third thickness d3 (see FIG. 10) of a memory chip stack 7 (see FIG. 10). In an example process, data on the thickness of the memory chip stack 7 may be obtained. Next, a difference between the thickness of the memory chip stack 7 and the thickness of the first wafer 3w may be calculated. The first thickness d1 of the second wafer 5w may be substantially equal or similar to the difference between the third thickness d3 of the memory chip stack 7 and the second thickness d2 of the first wafer 3w. The grinding process may change the thickness of the second wafer 5w to the first thickness d1. For example, the third thickness d3 of the memory chip stack 7 may be greater than about 780 μm. The second thickness d2 of the first wafer 3w may be about 780 μm. The first thickness d1 of the second wafer 5w may be less than the second thickness d2 of the first wafer 3w. For example, the first thickness d1 of the second wafer 5w may range from 10 μm to 780 μm. For example, the first thickness d1 of the second wafer 5w may range from 10 μm to 50 μm. However, embodiments of the inventive concepts are not necessarily limited thereto. The thicknesses of the second wafer 5w, the first wafer 3w and the memory chip stack 7 may be variously changed. As the first thickness d1 of the second wafer 5w decreases, power integrity (PI) may increase.

Figure 6:
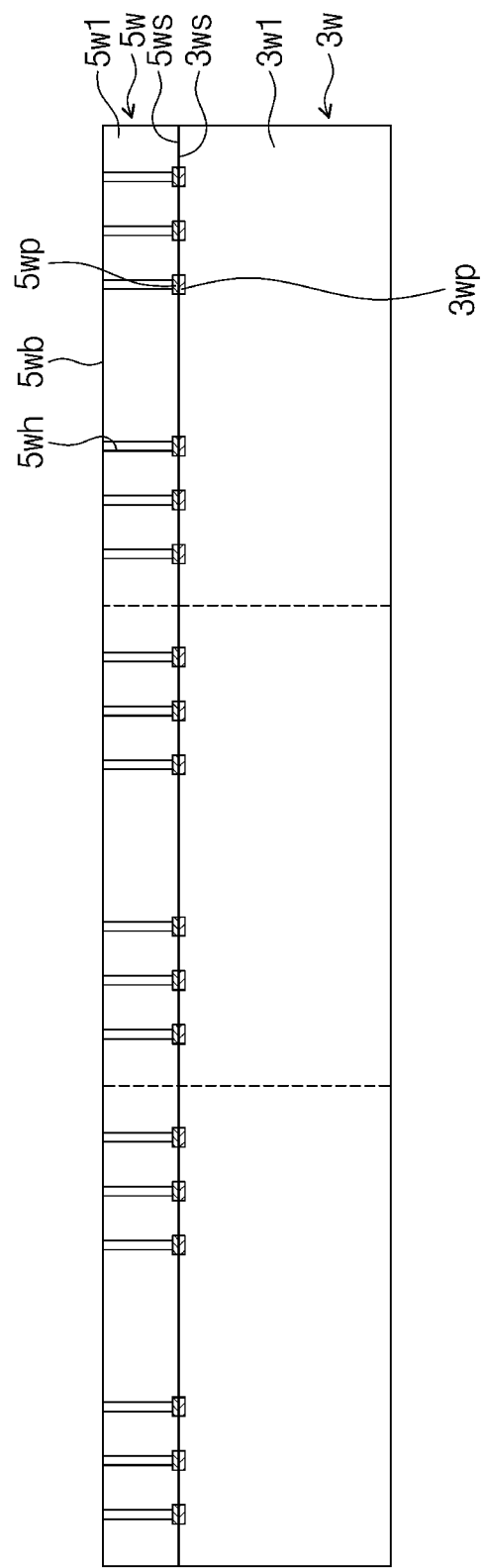

Referring to FIG. 6, a via hole 5wh may penetrate the second wafer 5w. The via hole 5wh may connect the active surface 5ws and the inactive surface (e.g., the bottom surface) 5wb of the second wafer 5w. In some embodiments, a plurality of the via holes 5wh may be formed in the second wafer 5w. The plurality of via holes 5wh may be laterally spaced apart from each other.

Figure 7:
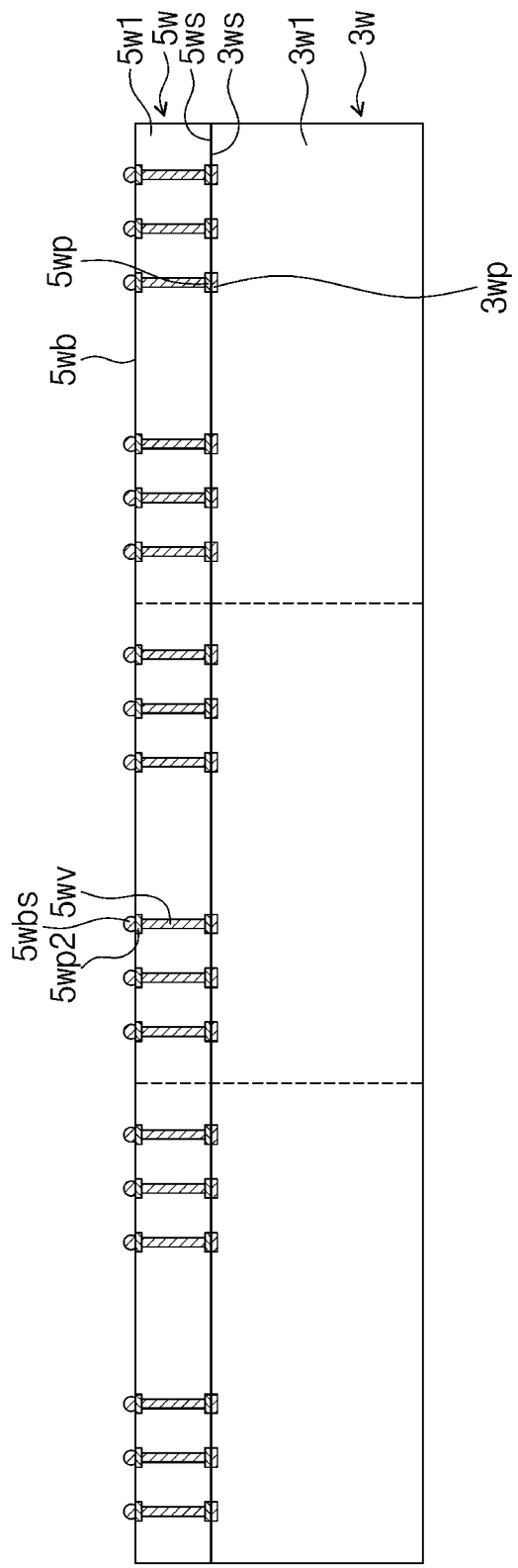

Referring to FIG. 7, the via hole 5wh may be filled with a conductive material. For example, a through-via 5wv may be formed by filling the via hole 5wh with the conductive material. A lower pad 5wp2 may be formed on the through-via 5wv. The lower pad 5wp2 may electrically connect the through-via 5wv to a connection solder ball 5wbs. In the above embodiments, the second wafer 5w may be ground in the state in which the second wafer 5w is bonded to the first wafer 3w, and then, the through-via 5wv may be formed. However, embodiments of the inventive concepts are not necessarily limited thereto. In certain embodiments, the through-via may be formed, and then, the bonding process and the grinding process may be performed. For example, the order of the formation of the through-via, the bonding process and the grinding process may be changed.

Figure 8:
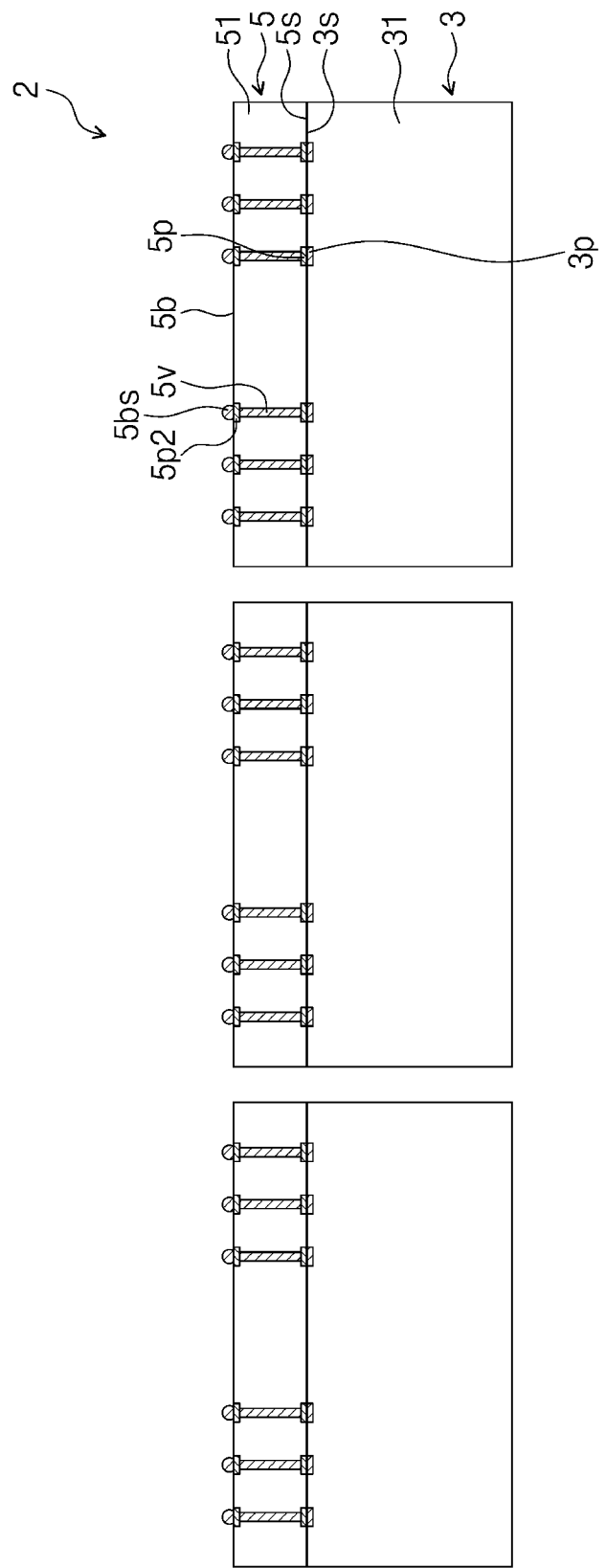

Referring to FIGS. 8 and 2, the sawing of the first and second wafers bonded to each other (S4) may include sawing the first and second wafers to form a plurality of individual chips. The sawed first wafer may be referred to as a first semiconductor chip 3. The first semiconductor chip 3 may be a logic chip. The sawed second wafer may be referred to as a silicon capacitor layer 5. In some embodiments, a thickness of a body 51 of the silicon capacitor layer 5 may be less than a thickness of a body 31 of the first semiconductor chip 3. A single chip in which the silicon capacitor layer 5 is bonded to the first semiconductor chip 3 may be referred to as a bonded chip 2.

Figure 9:
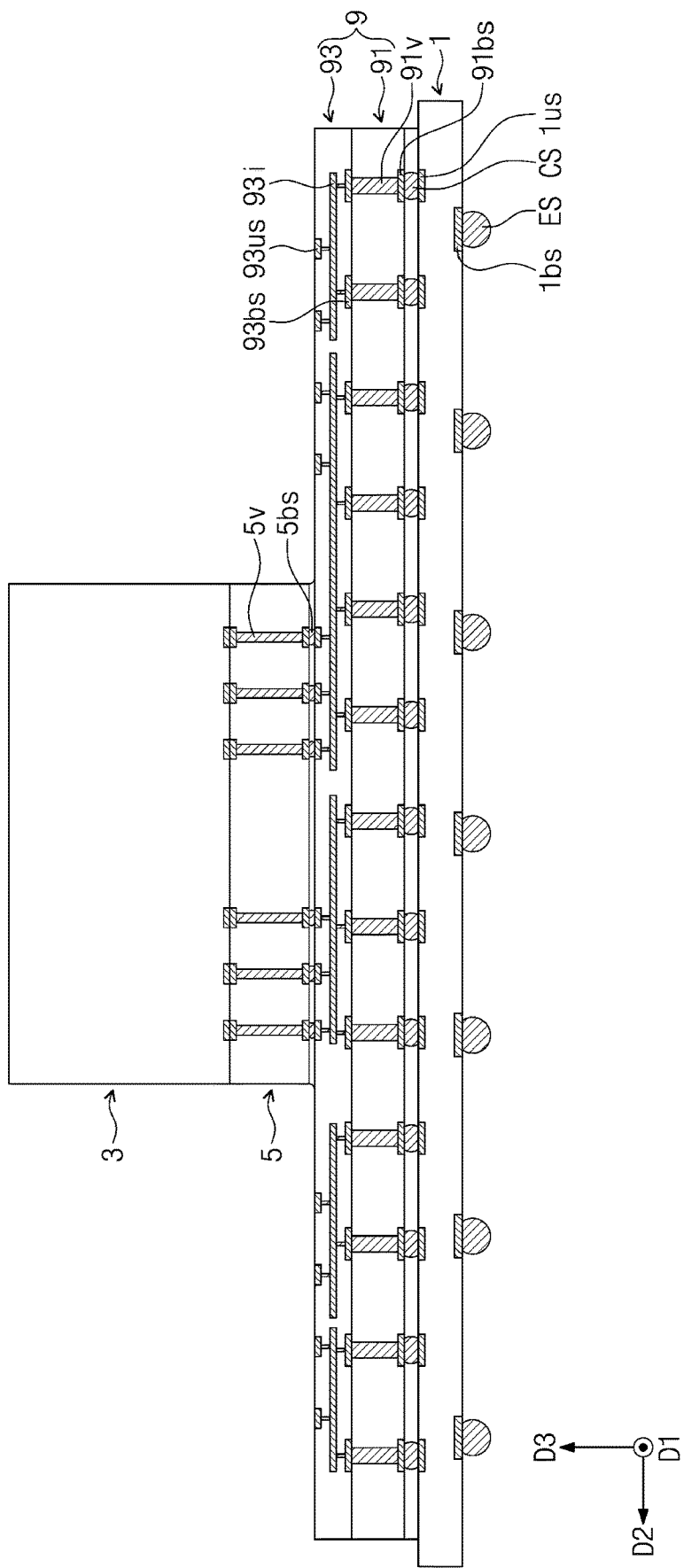

Referring to FIGS. 9 and 2, the coupling of the bonded chip onto the interposer (S5) may include bonding the bonded chip 2 (see FIG. 8) onto the interconnection layer 93 of the interposer 9. For example, the silicon capacitor layer 5 of the bonded chip 2 may be bonded onto the interconnection layer 93 of the interposer 9. The interconnection layer 93 may include an upper interconnection pad 93us, a lower interconnection pad 93bs, and an interconnection line 93i. The interposer substrate 91 may include an interposer via 91v and an interposer pad 91bs. The substrate 1 may include an upper substrate pad 1us and a lower substrate pad 1bs. The upper interconnection pad 93us may be connected to the lower interconnection pad 93bs through the interconnection line 93i. The lower interconnection pad 93bs may be connected to the interposer via 91v. The interposer via 91v may be connected to the upper substrate pad 1us through the interposer pad 91bs. For example, the interposer via 91v may connect to the interposer pad 91bs, which may connect to the connection ball CS, which may connect to the substrate pad 1us. The silicon capacitor layer 5 may be connected to the upper interconnection pad 93us through a connection solder ball 5bs. Thus, the through-via 5v may be connected to the interposer 9.

Figure 10:
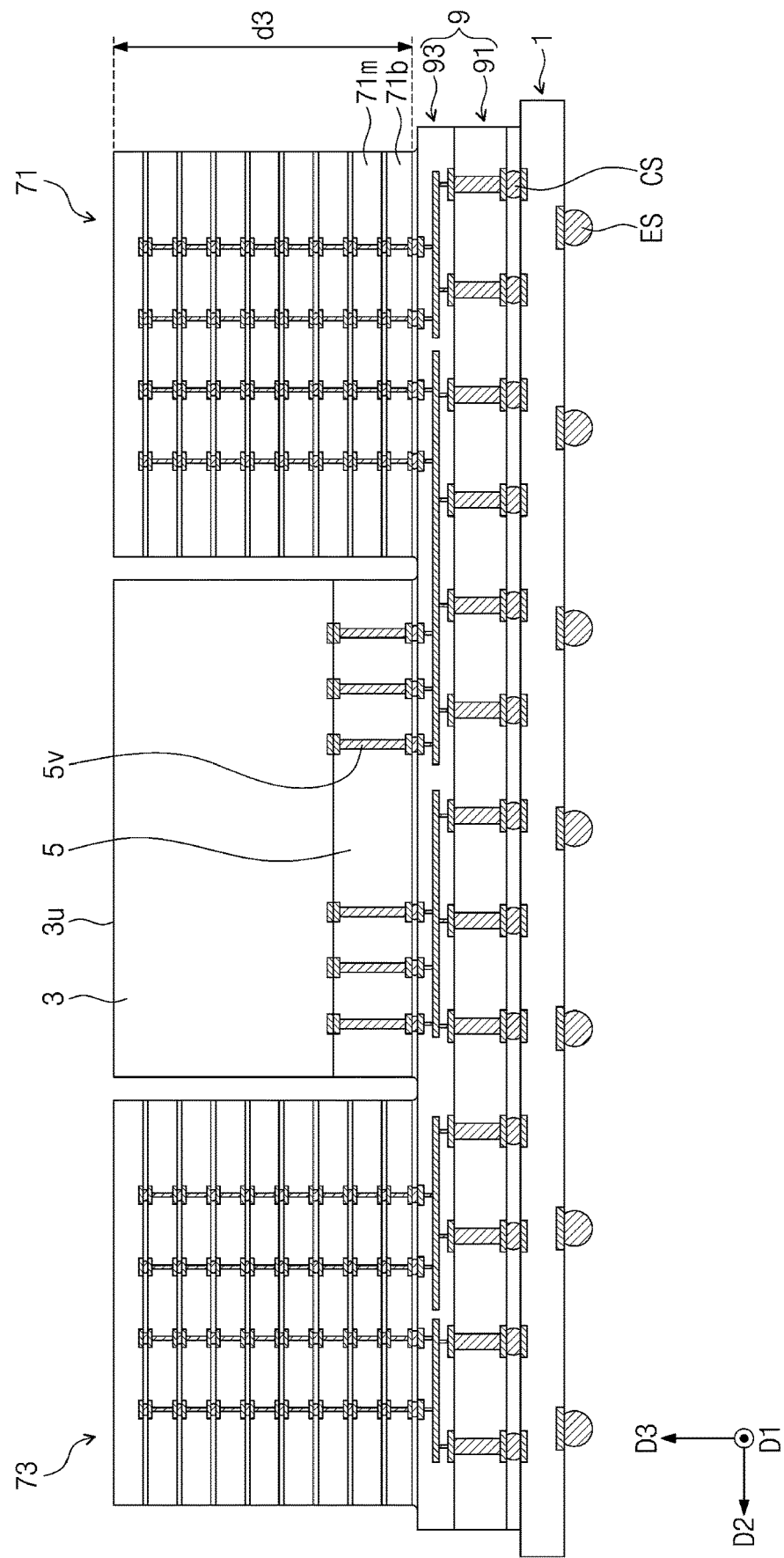

Referring to FIGS. 10 and 2, the coupling of the memory chip stack onto the interposer (S6) may include disposing the memory chip stack on the interposer 9 without overlapping with the first semiconductor chip 3 and the silicon capacitor layer 5 in a vertical direction. In some embodiments, the memory chip stack may include a first memory chip stack 71 and a second memory chip stack 73. The first memory chip stack 71 may include a lower logic chip 71b and a memory chip 71m. The memory chip 71m may be stacked on the lower logic chip 71b. The memory chip 71m may be provided in plurality. For example, 8, 12 or 16 memory chips 71m may be provided. However, embodiments of the inventive concepts are not necessarily limited thereto, and the number of memory chips 71m may vary. The plurality of memory chips 71m may be vertically stacked.

Figure 11:
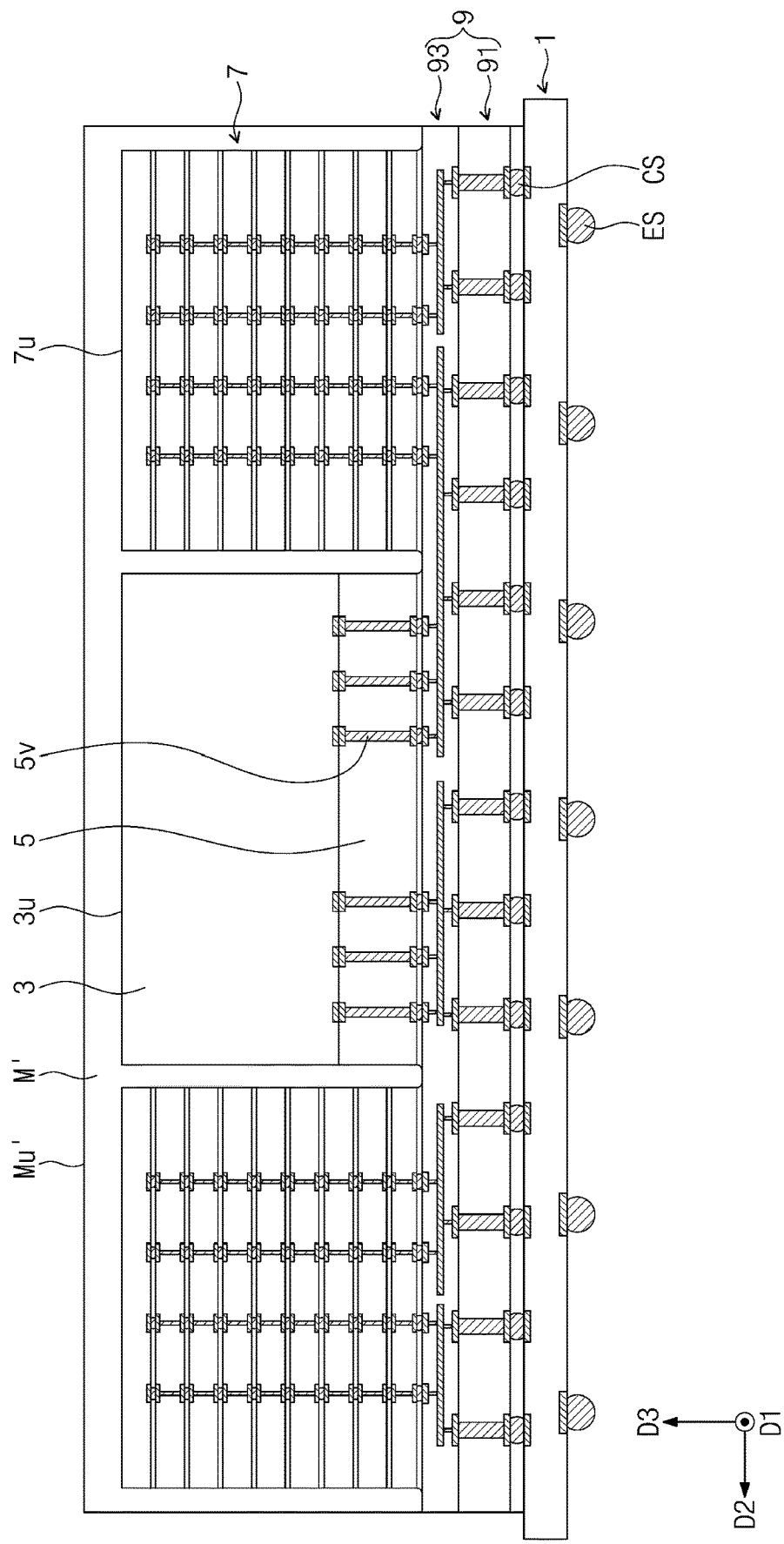

Referring to FIGS. 11 and 2, the forming of the molding layer (S7) may include forming a molding layer M' at least partially surrounding side surfaces of the silicon capacitor layer 5, the first semiconductor chip 3 and the memory chip stack 7. The molding layer M' may include an epoxy molding compound (EMC). In some embodiments, the molding layer M' may at least partially cover a top surface of the first semiconductor chip 3 and a top surface of the memory chip stack 7.

The forming of the molding layer (S7) may further include grinding the molding layer M'. A top surface Mu' of the molding layer M' may be ground. In some embodiments, the top surface Mu' of the molding layer M' may be ground until the top surface of the first semiconductor chip 3 and the top surface of the memory chip stack 7 are exposed. For example, the grinding process may be performed until the top surface Mu of the molding layer M is coplanar with the top surface 3u of the first semiconductor chip 3 and the top surface 7u of the memory chip stack 7 as illustrated in FIG. 1.

According to the embodiments of the inventive concepts, both the top surface of the first semiconductor chip and the top surface of the memory chip stack may be exposed by the molding layer. Thus, heat generated from the memory chip stack as well as the first semiconductor chip may be effectively dissipated or released. As a result, total performance of the semiconductor package may be increased.

Figure 12:
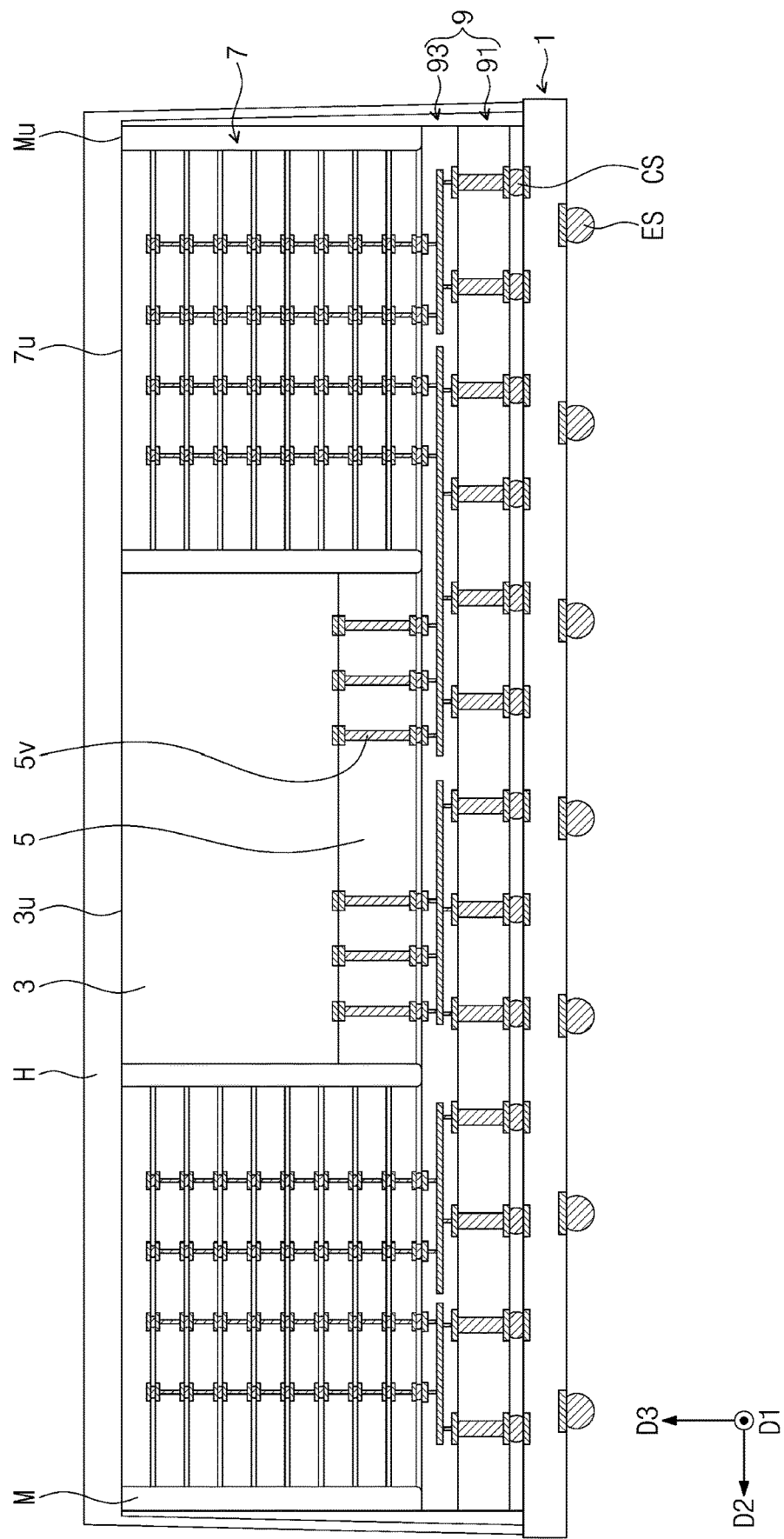
FIG. 12 is a cross-sectional view illustrating a semiconductor package according to some embodiments of the inventive concepts.

Referring to FIG. 12, a semiconductor package may further include a heat slug H. The heat slug H may at least partially cover the molding layer M. For example, the heat slug H may at least partially cover the top surface Mu of the molding layer M, the top surface 3u of the first semiconductor chip 3, and the top surface 7u of the memory chip stack 7. Heat generated from the first semiconductor chip 3 and the memory chip stack 7 may transfer to the heat slug H, and then be dissipated or released to the outside by the heat slug H. In some embodiments, a pipe containing fluid for circulating heat may be coupled to or bonded on the heat slug H.

According to the embodiments of the inventive concepts, heat may be dissipated or released to the outside by the heat slug. The heat slug may be in contact with both the top surface of the first semiconductor chip and the top surface of the memory chip stack, and thus heat generated from the first semiconductor chip and the memory chip stack may be effectively dispersed to the outside. As a result, total performance of the semiconductor package may be increased.

According to the semiconductor package and the method of manufacturing the same of the inventive concepts, the heat dissipation efficiency of the semiconductor package may be increased. An example semiconductor package of the present inventive concepts may have memory chip stacks and a semiconductor chip each with top surfaces that are substantially coplanar, which may increase the efficiency of heat dissipation in the semiconductor package.

According to the semiconductor package and the method of manufacturing the same of the inventive concepts, the performance of the semiconductor chip may be increased.

According to the semiconductor package and the method of manufacturing the same of the inventive concepts, the power integrity (PI) may be increased.

According to the semiconductor package and the method of manufacturing the same of the inventive concepts, the manufacturing processes may be simplified. While the inventive concept has been particularly shown and described with reference to embodiments thereof, it will be understood that various changes in form and details may be made therein without departing from the spirit and scope of the following claims.

What is claimed is:

1. A semiconductor package, comprising:
    a substrate;
    an interposer disposed on the substrate;
    a semiconductor chip stack disposed directly on the interposer, wherein the interposer is disposed between the semiconductor chip stack and the substrate;
    a silicon capacitor layer disposed directly on the interposer;
    a first semiconductor chip disposed directly on the silicon capacitor layer; and
    a molding layer at least partially surrounding side surfaces of the semiconductor chip stack, the silicon capacitor layer and the first semiconductor chip,
    wherein the interposer includes:
        an interposer substrate; and
        an interconnection layer, and
    wherein the interconnection layer includes a plurality of upper interconnection pads, a plurality of lower interconnection pads, and a plurality of interconnection lines disposed between the plurality of upper interconnection pads and the plurality of lower interconnection pads, with each of the plurality of interconnection lines connected to multiple upper pads of the plurality of upper interconnection pads and multiple lower interconnection pads of the plurality of lower interconnection pads,
    wherein the semiconductor chip stack and the first semiconductor chip are spaced apart from each other in a horizontal direction that is an extending direction of the substrate,
    wherein a bottom surface of the semiconductor chip stack proximate to the substrate is coplanar with a bottom surface of the silicon capacitor layer,
    wherein a top surface of the first semiconductor chip opposite a surface disposed on the silicon capacitor layer is coplanar with a top surface of the molding layer and a top surface of the semiconductor chip stack,
    wherein the semiconductor chip stack includes a high bandwidth memory (HBM) stack including a plurality of memory chips,
    wherein the semiconductor chip stack is thicker than the first semiconductor chip. wherein the first semiconductor chip is thicker than each of the plurality of memory chips, and
    wherein an embedded capacitor is disposed in the silicon capacitor layer.

2. The semiconductor package of claim 1, wherein the silicon capacitor layer further comprises a through-via electrically connecting the first semiconductor chip to the interposer.

3. The semiconductor package of claim 2, wherein the embedded capacitor is connected to the through-via.

4. The semiconductor package of claim 1, wherein the first semiconductor chip includes a logic chip.

5. The semiconductor package of claim 1, wherein the first semiconductor chip and the silicon capacitor layer are coupled to each other by a direct wafer bonding process such that a bottom surface opposite to the top surface of the first semiconductor chip is in contact with a top surface of the silicon capacitor layer.

6. The semiconductor package of claim 5, wherein a width of the first semiconductor chip in a horizontal direction is substantially equal to a width of the silicon capacitor layer in the horizontal direction.

7. The semiconductor package of claim 1, wherein a thickness of the silicon capacitor layer is less than a thickness of the first semiconductor chip.

8. The semiconductor package of claim 7, wherein the thickness of the silicon capacitor layer ranges from 10 μm to 780 μm.

9. The semiconductor package of claim 8, wherein the thickness of the silicon capacitor layer ranges from 10 μm to 50 μm.

10. The semiconductor package of claim 1, wherein the silicon capacitor layer is thicker than each of the plurality of memory chips.

11. The semiconductor package of claim 1, wherein a thickness of the semiconductor chip stack is greater than about 780 μm.

12. The semiconductor package of claim 1, further comprising:
    a heat slug in contact with the top surface of the first semiconductor chip and the top surface of the semiconductor chip stack.

13. The semiconductor package of claim 1, wherein the embedded capacitor is completely buried in the silicon capacitor layer.

14. The semiconductor package of claim 1, wherein the embedded capacitor comprises two electrodes, with one electrode being electrically linked to the through-via and the other being electronically connected to ground.

* * * * *